United States Patent
Sever

(10) Patent No.: US 9,269,423 B2
(45) Date of Patent: Feb. 23, 2016

(54) LATCH-BASED MEMORY ARRAY

(71) Applicant: DOLPHIN INTEGRATION, Meylan (FR)

(72) Inventor: Ilan Sever, Kfar-Vitkin (IL)

(73) Assignee: Dolphin Integration (FR)

(*) Notice: Subject to any disclaimer, the term of this patent is extended or adjusted under 35 U.S.C. 154(b) by 150 days.

(21) Appl. No.: 14/051,357

(22) Filed: Oct. 10, 2013

(65) Prior Publication Data

US 2014/0104936 A1    Apr. 17, 2014

(30) Foreign Application Priority Data

Oct. 11, 2012    (FR) ...................... 12 59706

(51) Int. Cl.
- *G11C 7/10* (2006.01)
- *G11C 11/412* (2006.01)
- *G11C 11/418* (2006.01)
- *G11C 11/419* (2006.01)
- *G11C 29/08* (2006.01)
- *G11C 7/22* (2006.01)

(52) U.S. Cl.
CPC ............ *G11C 11/412* (2013.01); *G11C 11/418* (2013.01); *G11C 11/419* (2013.01); *G11C 29/08* (2013.01); *G11C 7/106* (2013.01); *G11C 7/1051* (2013.01); *G11C 7/1057* (2013.01); *G11C 7/1078* (2013.01); *G11C 7/22* (2013.01)

(58) Field of Classification Search
CPC ...... G11C 7/1051; G11C 7/1078; G11C 7/22; G11C 7/106; G11C 7/1057
USPC ................... 365/189.05, 230.08, 185.09, 149
See application file for complete search history.

(56) References Cited

U.S. PATENT DOCUMENTS

| | | |
|---|---|---|
| 5,150,326 A | 9/1992 | Aoki |
| 5,469,380 A | 11/1995 | Iio |
| 5,535,159 A | 7/1996 | Nii |
| 6,005,794 A | 12/1999 | Sheffield et al. |
| 6,201,741 B1 * | 3/2001 | Kondo et al. ............ G11C 8/16 365/149 |

(Continued)

FOREIGN PATENT DOCUMENTS

JP    H04298887 A    10/1992

OTHER PUBLICATIONS

"Office Action Dated Nov. 13, 2014", issued in counterpart UK Patent Application No: GB1317927.0 (2618-035us1).

(Continued)

*Primary Examiner* — Jason Lappas
(74) *Attorney, Agent, or Firm* — Kaplan Breyer Schwarz & Ottesen, LLP

(57) ABSTRACT

The invention concerns a memory array having memory cells arranged in columns and rows, the memory cells of each column being coupled to at least one common write line of their column, the memory cells of each row being coupled to a common selection line of their row, wherein each of the memory cells includes a latch formed of a pair of inverters cross-coupled between first and second storage nodes; a first transistor coupled between the first storage node and a first test data input; and a second transistor coupled between the second storage node and a second test data input.

11 Claims, 2 Drawing Sheets

(56) References Cited

U.S. PATENT DOCUMENTS

| | | |
|---|---|---|
| 6,473,334 B1 | 10/2002 | Bailey et al. |
| 8,081,503 B1 | 12/2011 | Nguyen et al. |
| 2003/0200493 A1 | 10/2003 | Campbell |
| 2004/0004898 A1 | 1/2004 | Kim et al. |
| 2006/0198204 A1 | 9/2006 | Lambrache et al. |
| 2007/0086253 A1 | 4/2007 | Gerowitz et al. |
| 2010/0296335 A1 | 11/2010 | Sashadri et al. |
| 2011/0063894 A1 | 3/2011 | Lee et al. |
| 2011/0209109 A1 | 8/2011 | Wang et al. |
| 2012/0163102 A1 | 6/2012 | McIntyre et al. |

OTHER PUBLICATIONS

"Office Action dated May 11, 2015", issued in counterpart UK Patent Application No: GB1317927.0 (2618-035us1).

"Office Action dated Jul. 21, 2015", issued in counterpart UK Patent Application No: GB1317927.0 (2618-035us1).

Juerfen Harms, "International Search Report for Parent French Application No. FR 12/59709", Jun. 18, 2013, Publisher: INPI, Published in: FR.

Tae-Hyoung Kim et al., "A 0.2 V, 480kb Subthreshold SRAM with 1 k Cells Per Bitline for Ultra-Low-Voltage Computing", Feb. 2008, vol. 43, No. 2, Publisher: IEEE Journal of Solid State Circuits.

* cited by examiner

US 9,269,423 B2

LATCH-BASED MEMORY ARRAY

FIELD

The present disclosure relates to the field of memory devices, and in particular to a memory array and a method of operating a memory array based on latches.

BACKGROUND

Memory devices generally comprise an array of memory cells, each memory cell storing one bit of data. SRAM (Static Random Access Memory) is an example of a type of volatile memory array that provides a relatively compact means of storing data.

There are a number of drawbacks of memory arrays such as SRAM arrays. In particular, read operations tend to be relatively slow due to the use of common bit lines for writing to the memory cells and reading data stored by the memory cells, which must be charged and discharged. Furthermore, it is not possible to read more that one memory cell in a given column of the memory array at once. A further drawback is that in order to perform a global reset of the memory device, it is necessary to address each word line of the memory cell in turn and write the reset value (for example a logic 0), which is a time consuming process.

Similarly, testing of such memory arrays is relatively slow and complex, as this involves performing a write and read operation to each memory cell in turn.

There is thus a need in the art for an improved memory array overcoming one or more of these drawbacks.

SUMMARY

Embodiments of the present disclosure aim to at least partially address one or more needs in the prior art.

According to one aspect, there is provided a memory array comprising memory cells arranged in a plurality of columns and in a plurality of rows, the memory cells of each column being coupled to at least one common write line of their column, the memory cells of each row being coupled to a common selection line of their row, wherein each of the memory cells comprises: a latch formed of a pair of inverters cross-coupled between first and second storage nodes; a first transistor coupled between the first storage node and a first test data input; and a second transistor coupled between the second storage node and a second test data input.

According to one embodiment, each memory cell further comprises a data output, each of the data outputs being independently connected to an output port of the memory array.

According to one embodiment, each of the memory cells comprises a buffer providing the data output, the buffer comprising a third transistor coupling the data output to a first supply voltage and a fourth transistor coupling the data output to a second supply voltage, the third and fourth transistors having their control nodes coupled to the first or second storage node.

According to one embodiment, a first of the memory cells has its first and second test data inputs coupled to test sequence input circuitry, and wherein a second of the memory cells has its first test data input coupled to the first storage node of the first memory cell via a first buffer of the first memory cell and its second test data input coupled to the second storage node of the second memory cell via a second buffer of the first memory cell.

According to one embodiment, the first and second transistors of the first memory cell are configured to receive a clock signal, and wherein the first and second transistors of the second memory cell are configured to receive the inverse of the clock signal.

According to one embodiment, the memory cells of the array are coupled in series by their test data inputs and data outputs to form a test chain, and wherein the first memory cell and alternate memory cells thereafter of the test chain receive the clock signal on a first clock line, and wherein the other memory cells of the test chain receive the inverse of the clock signal on a second clock line.

According to one embodiment, the first and second memory cells are arranged in a first column of the memory array, the first memory cell being at one end of the first column at a first side of the memory array, and a final memory cell being at the other end of the first column at a second side of the memory array; the memory array comprises a second column adjacent to the first column, another first memory cell being at one end of the second column at the first side of the memory array and a another final memory cell being at the other end of the second column at the second side of the memory array; a first test data input of the final memory cell of the second column is coupled to the first storage node of the final memory cell of the first column via the first buffer; and a second test data input of the final memory cell of the second column is coupled to the second storage node of the final memory cell of the first column via the second buffer.

According to one embodiment, the at least one common write line comprises a first common write line and a second common write line.

According to one embodiment, each of the memory cells further comprises a fifth transistor coupled between the first storage node and a first supply voltage, and a sixth transistor coupled between the second storage node and the first supply voltage, the control node of the fifth transistor being coupled to the first common write line, and the control node of the sixth transistor being coupled to the second common write line.

According to one embodiment, each memory cell further comprises a seventh transistor coupled between the first storage node and the first supply voltage in series with the fifth transistor, and an eighth transistor coupled between the second storage node and the first supply voltage in series with the sixth transistor, wherein control nodes of the seventh and eighth transistors are coupled to the common selection line of the row.

According to one embodiment, the first and second inverters each comprises first and second p-channel MOS transistors coupled in series with an n-channel MOS transistor between first and second supply voltages.

According to a further aspect, there is provided a memory array comprising memory cells arranged in a plurality of columns and in a plurality of rows, the memory cells of each column being coupled to at least one common write line of their column, the memory cells of each row being coupled to a common selection line of their row, wherein each of the memory cells comprises: a latch formed of a pair of inverters cross-coupled between first and second storage nodes; and a buffer providing a data output, the buffer comprising a third transistor coupling the data output to a first supply voltage and a fourth transistor coupling the data output to a second supply voltage, the third and fourth transistors having their control nodes coupled to the first or second storage node, and wherein the data output of each memory cell is independently connected to a first output port of the memory array.

According to one embodiment, the at least one common write line comprises a first common write line and a second common write line.

According to one embodiment, each of the memory cells comprises a latch formed of a pair of inverters cross-coupled between first and second storage nodes.

According to one embodiment, the data output of each memory cell is also independently connected to a second output port of the memory array.

According to a further aspect, there provided a method of testing a memory array comprising memory cells arranged in a plurality of columns and in a plurality of rows, the memory cells of each column being coupled to at least one common write line of their column, the memory cells of each row being coupled to a common selection line of their row, wherein each of the memory cells comprises a latch formed of a pair of inverters cross-coupled between first and second storage nodes; a first transistor coupled between the first storage node and a first test data input; and a second transistor coupled between the second storage node and a second test data input, the method comprising: applying a first test signal to the first test data input and a second test signal to the second test data input; and activating the first and second transistors such that the first test signal is applied to the first storage node and the second test signal is applied to the second storage node.

According to a further aspect, there provided a method of reading at least one data bit from a memory array comprising memory cells arranged in a plurality of columns and in a plurality of rows, the memory cells of each column being coupled to at least one common write line of their column, the memory cells of each row being coupled to a common selection line of their row, wherein each of the memory cells comprises a latch formed of a pair of inverters cross-coupled between first and second storage nodes and a data output provided by a buffer comprising a third transistor coupling the data output to a first supply voltage and a fourth transistor coupling the data output to a second supply voltage, the third and fourth transistors having their control nodes coupled to the first or second storage node, the data output of each memory cell being independently connected to a first output port (105A, 105B) of the memory array, the method comprising: providing a first address signal to the first output port to select one or more of the data outputs of the memory cells.

According to one embodiment, the data output of each memory cell is also independently connected to a second output port of the memory array, the method further comprising providing a second address signal to a second output port of the memory array to select one or more data outputs of the memory cells.

According to another aspect, there is provided a memory array comprising memory cells arranged in a plurality of columns and in a plurality of rows, the memory cells of each column being coupled to at least one common write line of their column, the memory cells of each row being coupled to a common selection line of their row, wherein each of the memory cells comprises a data output. In some embodiments, each of the data outputs is independently connected to an output port of the memory array.

According to another embodiment, the first and second memory cells are arranged in a first column of the memory array, and first and second test data inputs of a final memory cell in a second column of the memory array are respectively coupled, via corresponding output buffers, to the first and second storage nodes of a final memory cell in the first column.

According to another embodiment, the memory cells of the array are coupled in series by their test data inputs and data outputs to form a test chain, and alternate memory cells of the test chain receive a clock signal on a first clock line, and the other memory cells of the test chain receive the inverse of the clock signal on a second clock line.

According to another aspect, there is provided a configurable logic device comprising at least one interconnection or logic function programmable by a configuration bit stored in a configuration memory, the configuration memory comprising the above memory array.

According to another aspect, there is provided a method of reading at least one data bit from a memory array comprising memory cells arranged in a plurality of columns and in a plurality of rows, the memory cells of each column being coupled to at least one common write line of their column, the memory cells of each row being coupled to a common selection line of their row, wherein each of the memory cells comprises a data output. In some embodiments, each of the data outputs is independently connected to an output port of the memory array, and the method comprises providing an address signal to the output port to select one or more of the data outputs of the memory cells.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
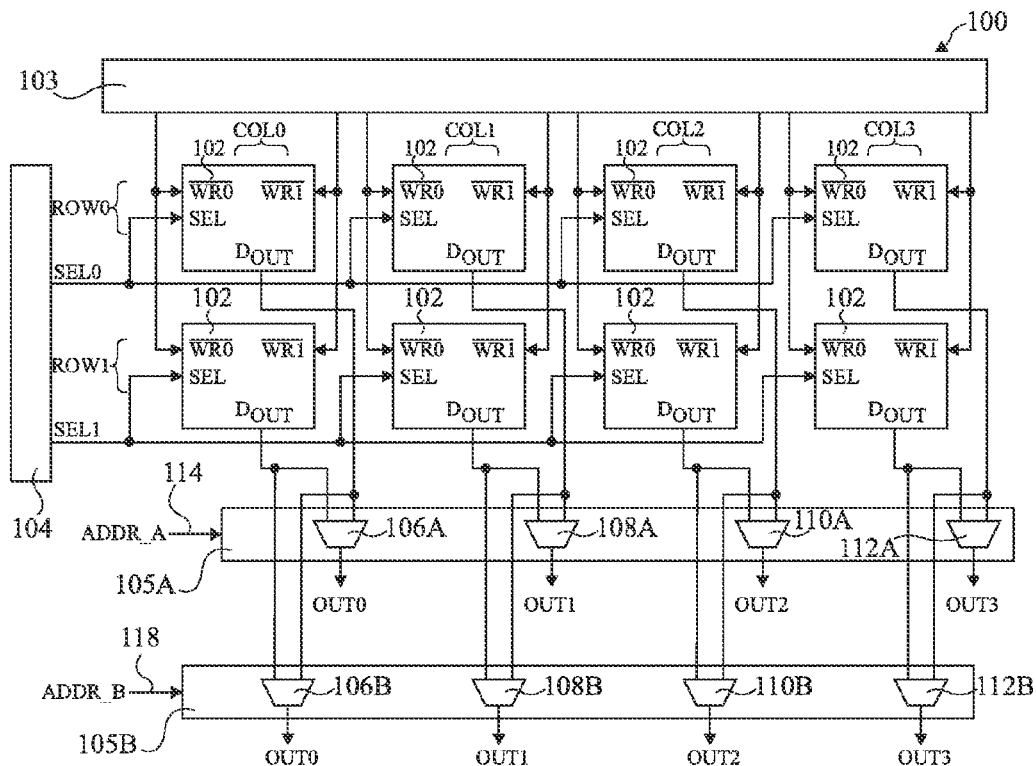
FIG. 1 schematically illustrates a memory array according to an example embodiment.

FIG. 1 illustrates a memory array 100 according to an example embodiment of the present disclosure.

The memory array 100 comprises a plurality of memory cells 102 arranged in rows and columns. In the example of FIG. 1, there are four columns COL0 to COL3 and two rows ROW0 and ROW1 of memory cells 102, although in alternative embodiments the array 100 could comprise fewer memory cells or many more memory cells.

Each of the memory cells 102 stores one bit of data, and thus the memory array 100 of FIG. 1 stores 8 bits of data. Of course, the memory array could be much larger, for example storing up to 1 k bit of data or more.

As will be described in more detail below, each of the memory cells 102 is based on a latch, and for example comprises complementary write inputs $\overline{WR0}$ and $\overline{WR1}$ and a selection input SEL. The write signals on the common write lines are for example generated by write control circuitry 103. Furthermore, the memory cells in row ROW0 for example receive a selection signal SEL0 on a common selection line of row ROW0, and those in row ROW1 for example receive a selection signal SEL1 on a common selection line of row ROW1. The selection signals are for example generated by selection control circuitry 104.

Furthermore, each of the memory cells 102 for example comprises a data output $D_{OUT}$. As explained in more detail below, the output signals at the data outputs $D_{OUT}$ are generated by an output buffer of each memory cell. Furthermore, the data output $D_{OUT}$ of each memory cell is for example permanently and independently coupled to one or more output ports. In the example of FIG. 1, the data outputs $D_{OUT}$ of each of the memory cells 102 is connected to an output port 105A and to an output port 105B.

The output port 105A for example comprises four multiplexers 106A, 108A, 110A and 112A each of which receives at its two data inputs the respective output signals from the memory cells 102 of the columns COL0 to COL3 respectively. For example, multiplexer 106A has its data inputs coupled respectively to the data outputs of the two memory cells of column COL0. The multiplexers 106A to 112A respectively provide output signals OUT0 to OUT3 corresponding to the data selected to be read from the memory cells of columns COL0 to COL3 respectively.

The output port 105A receives an address signal ADDR_A on an input line 114 selecting the row of the memory array 100 that is to be read. This address is for example used to control each of the multiplexers 106A to 112A to select the data output of the corresponding row.

The output port 105B is for example identical to the output port 105A, and comprises four multiplexers 106B to 112B having inputs connected to the same lines as the respective multiplexers 106A to 112A of output port 105A. The output port 105B receives an address signal ADDR_B, which indicates the row to be read, which could be the same row as the one read by port 105A, or a different row.

In operation, during a write phase to the memory array 100, each row of memory cells 102 is for example written to in turn, after being selected by a corresponding selection signal. During each write operation, the write signals $\overline{WR0}$ and $\overline{WR1}$ provide the data that is to be written to the corresponding row.

A global reset is for example performed by selecting all of the rows of the memory array, and asserting all of the write signals $\overline{WR0}$ with the reset value, which is for example a logic "0", and all of the write signals $\overline{WR1}$ with the opposite value, for example a logic "1".

Reading of the data stored by the memory cells may be performed with very low latency due to the use of an output buffer in each memory cell 102. In particular, following a change in the address provided to one of the output ports 105A, 105B, the data output of the output port will change very quickly, because all of the data from the array of memory cells 102 is already available at its inputs. Furthermore, the data outputs of the memory cells are permanently available, and thus the read operation can be performed asynchronously. In particular, even if a read operation addresses a memory cell during a write operation of new data to that memory cell, the data output by the read port would simply change following a certain propagation delay.

Of course, while there are two output ports in the example of FIG. 1, in alternative embodiments there could be just one or more than two output ports. Furthermore, while in the example of FIG. 1 the output ports select one row of data at a time, it will be apparent to those skilled in the art that more than one row or a sub-row of data could be selected to be read.

In some embodiments, an output port could comprise one large multiplexer receiving the output data from all of the memory cells of the memory array 100, and the output port could provide the data serially on a single output line.

In alternative embodiments, an output port could comprise as many outputs as the number of memory cells in the array 100, in which case the output port for example comprises only output buffers, without any output multiplexers. In such a case, the data from all of the memory cells is continuously available at the output port without an address being provided and without a read operation being performed.

For example, the memory array could form a configuration memory of a configurable logic device, for example forming part of an FPGA (field programmable gate array). In such a case, each bit of data stored by the memory array 100 for example programs an interconnection or logic function of the configurable logic device.

Figure 2:
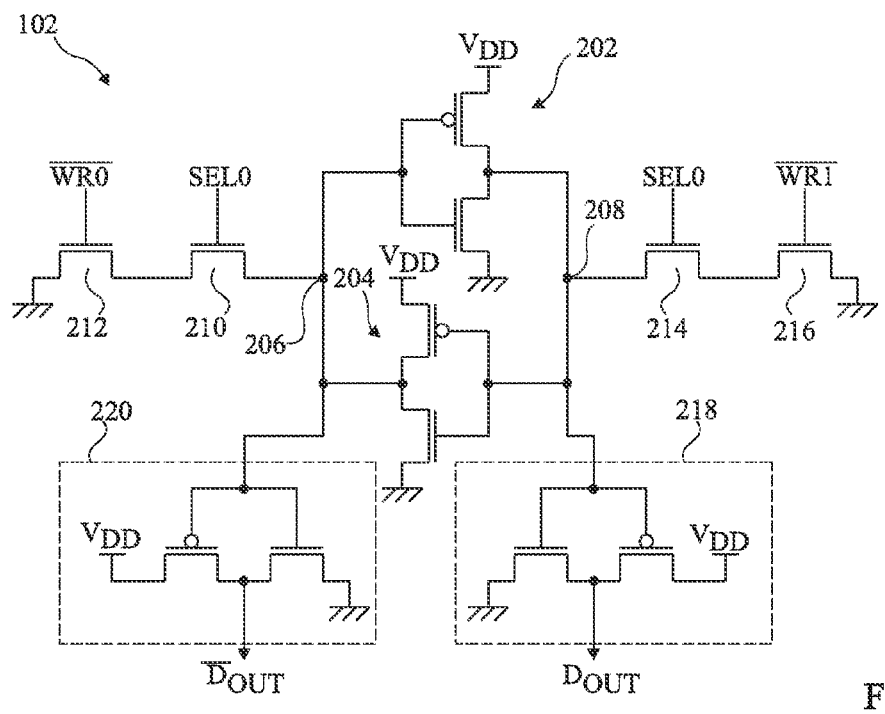
FIG. 2 schematically illustrates a memory cell of the memory array of FIG. 1 in more detail according to an example embodiment.

FIG. 2 schematically illustrates in more detail the memory cell 102 of column COL0 and row ROW0 of the memory array 100 according to an example embodiment. The other memory cells 102 of the memory array 100 for example have an identical structure, except that the input signals will be those of the corresponding column and row of the cell.

As illustrated, the memory cell 102 for example comprises a pair of inverters 202, 204, cross-coupled between storage nodes 206 and 208. The storage nodes 206, 208 store complementary voltage levels representing a bit of data. For example, a high level at node 206 and a low level at node 208 represents a logic "1", and a low level at node 206 and a high level at node 208 represents a logic "0".

In the example of FIG. 2, each of the inverters 202 and 204 comprises a p-channel MOS (PMOS) transistor coupled in series with an n-channel MOS (NMOS) transistor between first and second supply voltages, in this example $V_{DD}$ and ground. The gates of the PMOS and NMOS transistors of the inverter 202 are coupled to the storage node 206, and a node between these NMOS and PMOS transistors is coupled to the storage node 208. The gates of the PMOS and NMOS transistors of the inverter 204 are coupled to the storage node 208, and a node between these NMOS and PMOS transistors is coupled to the storage node 206.

The storage node 206 is equally coupled to ground via NMOS transistors 210 and 212 coupled in series. Similarly, the storage node 208 is coupled to ground via NMOS transistors 214 and 216 coupled in series. The gates of the NMOS transistors 210 and 214 are coupled to receive the selection signal SEL0. The gate of NMOS transistor 212 is coupled to receive the write signal $\overline{WR0}$, and the gate of NMOS transistor 216 is coupled to receive the write signal $\overline{WR1}$.

The storage node 208 is further coupled via an output buffer 218 to the data output $D_{OUT}$ of the memory cell 102. The data buffer 218 permits the data stored by the memory cell 102 to be read without disrupting the state of the memory cell 102. The output buffer 218 for example comprises a PMOS transistor and NMOS transistor coupled in series between first and second supply voltages, in this example $V_{DD}$ and ground. The gates of these transistors are coupled to the storage node 208, while the node between these transistors provides the data output $D_{OUT}$.

Optionally, a further output buffer 220 is provided, identical to the output buffer 218, and coupled to the storage node 206. Output buffer 220 provides the inverse output signal $\overline{D}_{OUT}$ of the data output $D_{OUT}$.

In operation, during the write phase of the memory cell 102, the selection signal SEL0 is high, activating transistors 210 and 214, and either the transistor 212 or the transistor 216 will be activated by the write signals $\overline{WR0}$ and $\overline{WR1}$. Thus one or the other of the storage nodes 206 and 208 will be pulled to ground, forcing a given state of the latch formed by inverters 202 and 204. When the selection signal goes low again, the corresponding state is maintained by the latch.

Figure 3:
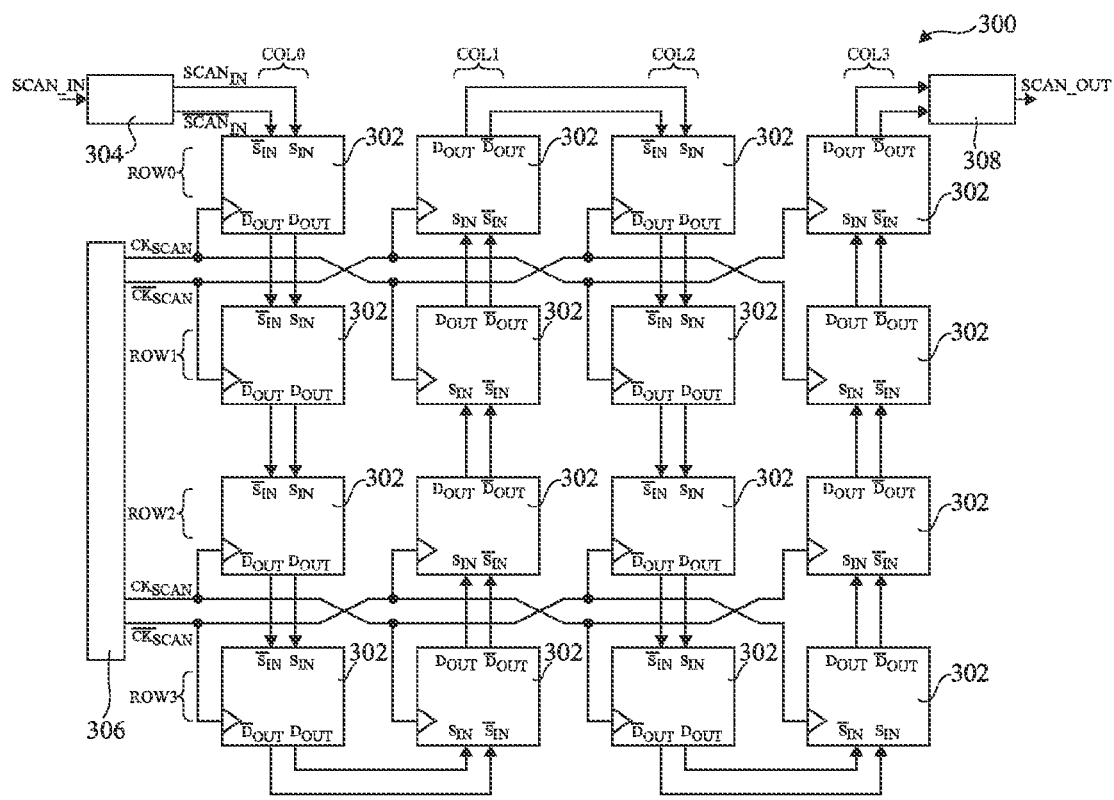
FIG. 3 schematically illustrates a memory array according to a further example embodiment.

FIG. 3 schematically illustrates a memory array 300 according to a further example embodiment.

In the example of FIG. 3, the memory array 300 comprises four columns COL0 to COL3 of memory cells 302, and four rows ROW0 to ROW3 of the memory cells 302.

The memory cells 302 each for example receives the same write and selection signals as the memory cells 102 of the memory array 100, but for the sake of clarity these signals have not been represented again in FIG. 3. Additionally, each of the memory cells 302 comprises complementary test data inputs $S_{IN}$ and $\overline{S}_{IN}$, a scan clock input, and an inverse data output $\overline{D}_{OUT}$ in addition to the normal data output $D_{OUT}$.

The memory cells 302 of the array 300 form a test chain, generally known in the art as a scan chain, for the purpose of testing the operation of each of the memory cells. In particular, the memory cells are all for example coupled in a chain by their test data inputs and data outputs. While not illustrated in FIG. 3, the data outputs are also for example each independently coupled to one or more output ports as for the array 100 of FIG. 1. However, it will be apparent to those skilled in the art that in alternative embodiments, the data outputs of the memory cells forming each column of the array could be coupled to an output port via a common column line.

In the example of FIG. 3, the data outputs $D_{OUT}$ and $\overline{D}_{OUT}$ of the first memory cell of column COL0 in row ROW0 are coupled to the test data inputs $S_{IN}$ and $\overline{S}_{IN}$ respectively of the second memory cell in column COL0, which is the memory cell in ROW1. Similarly, the data outputs of this second memory cell are coupled to test data inputs of the third memory cell of COL0, which is the memory cell in ROW2, and so on and so forth. The final memory cell of the column COL0 for example has its data outputs $D_{OUT}$ and $\overline{D}_{OUT}$ coupled to the test data inputs $S_{IN}$ and $\overline{S}_{IN}$ of the fourth memory cell in the next column COL1, and in column COL1, the memory cells are for example coupled in series in a similar fashion to those of column COL0, but from bottom to top. The test signals are for example passed to the third and fourth columns COL2 and COL3 in a similar fashion.

Test sequence input circuitry 304 for example provides test data $SCAN_{IN}$ and inverse test data $\overline{SCAN}_{IN}$ to the first memory cell of the array, which in this example is the one of column COL0 and row ROW0. The input circuitry 304 receives a scan input data signal SCAN_IN, and for example represents other elements of the scan chain, or a test data input port. The signals $SCAN_{IN}$ and $\overline{SCAN}_{IN}$ are for example generated based on the scan input data signal SCAN_IN.

Alternate memory cells 302 in the test chain formed by memory cells 302 for example receive the clock signal $CK_{SCAN}$, and the other cells receive the inverse clock $\overline{CK}_{SCAN}$. Thus, adjacent memory cells in the test chain are clocked by timing edges separated by half a clock period. The memory cells receiving the clock signal $CK_{SCAN}$ corresponds to a checkered pattern across the array, in other words the memory cells of columns COL0 and COL2 in row ROW0, the memory cells of columns COL1 and COL3 in row ROW1, the memory cells of columns COL0 and COL2 in row ROW2, and the memory cells of columns COL1 and COL3 in row ROW3. The remaining memory cells for example receive the inverse clock signal $\overline{CK}_{SCAN}$. The clock signals $CK_{SCAN}$ and $\overline{CK}_{SCAN}$ are for example generated by clock generation circuitry 306.

The final memory cell of the test chain, which in the example of FIG. 3 is the cell of column COL3 and row ROW0, for example has one or both of its data outputs coupled to a scan output stage 308 providing an output signal SCAN_OUT, which may in turn be coupled to further elements of the scan chain, or to an output port that provides the test data to verification circuitry for example located off-chip.

It will be apparent to those skilled in the art that the memory cells could be connected in series to form a test chain in a different order. For example, the cells in each row of the array could be coupled in series, each row being connected to the next at the left-hand or right-hand edge of the array.

Figure 4:
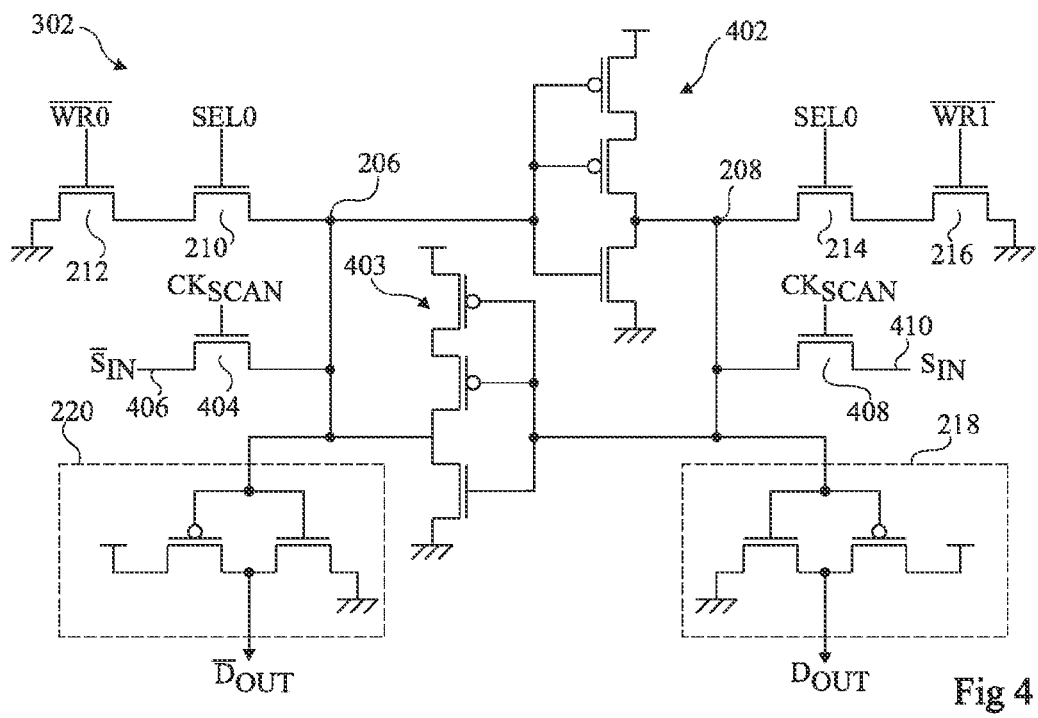
FIG. 4 schematically illustrates a memory cell of the memory array of FIG. 3 in more detail according to an example embodiment.

FIG. 4 schematically illustrates an example of the memory cell 302 of column COL0 and row ROW0 of the memory array 300 in more detail according to an example embodiment. The other memory cells 302 of the memory array 300 for example have an identical structure, except that the input signals will be those of the corresponding column and row of the cell.

The memory cell 302 has many of the same features as the memory cell 102 of FIG. 2, and such features have been labelled with like reference numerals and will not be described again in detail.

Rather than the inverters 202, 204 of memory cell 102, the memory cell 302 for example comprises a pair of cross-coupled inverters 402, 403, which are identical to inverters 202 and 204, except that they each comprise an additional PMOS transistor having its gate coupled to same storage node as the other PMOS and NMOS transistors. In particular, the inverters 402 and 403 each comprise two PMOS transistors coupled in series in place of the single PMOS transistors of inverters 202 and 204. An advantage of providing the additional PMOS transistor is that it increases the resistivity of the pull-up transistor through a combination of transistor operating conditions and body effect, thereby aiding the write process using the transistors 212 and 216.

The memory cell 302 additionally comprises an NMOS transistor 404 coupled between the storage node 206 and an input line 406, and an NMOS transistor 408 coupled between storage node 208 and a line 410. The input lines 406 and 410 form the test data inputs $\overline{S}_{IN}$ and $S_{IN}$ respectively. The control nodes of transistors 404 and 408 receive the clock signal $CK_{SCAN}$.

Under normal operation, the clock signals $CK_{SCAN}$ and $\overline{CK}_{SCAN}$ are for example held low, deactivating the scan chain. However, during a testing phase of the memory array 300, the clock signals $CK_{SCAN}$ and $\overline{CK}_{SCAN}$ are activated. For example, the testing phase is activated following manufacture of the memory array, to ensure proper functioning, and the test phase may also be performed one or more times during the lifetime of the memory array.

Upon a rising edge of the clock signal $CK_{SCAN}$, the storage nodes 206 and 208 of the first memory cell of the test chain are coupled by transistors 404 and 408 to the complementary test data inputs, causing these storage nodes 206, 208 to be written with the test data $\overline{S}_{IN}$ and $S_{IN}$. Then, with each rising edge and falling edge of the clock signal $CK_{SCAN}$, the test data is pushed from one memory cell to the next in the chain, until it arrives at the output stage 308.

An advantage of the memory arrays described herein is that they permit relatively fast read times, with low latency. Furthermore, by providing programming transistors in each memory cell, a global reset of the memory array may be performed quickly and simply. Furthermore, reading from the memory may be performed asynchronously.

A further advantage of the embodiment of FIGS. 3 and 4 is that the memory cells of the memory array can form a single test chain that permits all of the memory cells to be tested in a simple fashion. In particular, such scan testing permits a simple and very complete verification of the memory, which may be performed together with a scan test of other elements of the circuit, and without the use of dedicated memory Built-In-Self-Test (BIST) logic.

While a number of particular embodiments have been described, it will be apparent to those skilled in the art that there are many modifications and variations that can be applied.

For example, while embodiments have been described in which there is a pair of common write lines for each column of the memory array, in alternative embodiments there could be a single common write line for each column. Furthermore, while in the memory cell of FIG. 2 the common write lines activate one or the other of the transistors 212 and 214 in order to write to the cell, in alternative embodiments other write mechanisms could be used. For example, the common write lines could correspond to a pair of bit lines respectively coupled to the storage nodes 206 and 208 via the selection transistors 210 and 214.

Furthermore, while the embodiments herein have been described with reference to CMOS (complementary MOS) technology, it will be apparent to those skilled in the art that the principles taught herein could equally be applied to other transistor technologies, such as bipolar technology.

Furthermore, it will be apparent to those skilled in the art that, while columns of the memory array are illustrated running vertically and rows of the memory array are illustrated running horizontally in the figures, it will be apparent to those skilled in the art that the columns and rows could be formed in either direction.

Furthermore, it will be apparent to those skilled in the art that the supply voltages and ground voltages described herein could be inverted, and that the ground voltage could be at 0 V or at a different voltage level.

Furthermore, it will be apparent to those skilled in the art that the various features described with reference to the various embodiments could be combined, in alternative embodiments, in any combination.

The invention claimed is:

1. A memory array comprising memory cells arranged in a plurality of columns and in a plurality of rows, the memory cells of each column being coupled to at least one common write line of their column, the memory cells of each row being coupled to a common selection line of their row, each of the memory cells having:
   a latch formed of a pair of inverters cross-coupled between first and second storage nodes;
   a first transistor coupled between said first storage node and a first test data input; and
   a second transistor coupled between said second storage node and a second test data input;
   wherein a first of said memory cells has its first and second test data inputs coupled to test sequence input circuitry, and wherein a second of said memory cells has its first test data input coupled to the first storage node of said first memory cell via a first buffer of said first memory cell and its second test data input coupled to the second storage node of said first memory cell via a second buffer of said first memory cell.

2. The memory array of claim 1, wherein each memory cell further comprises a data output, each of the data outputs being independently connected to an output port of said memory array.

3. The memory array of claim 2, wherein said first buffer provides said data output and comprises a third transistor coupling said data output to a first supply voltage and a fourth transistor coupling said data output to a second supply voltage, the third and fourth transistors having their control nodes coupled to said first or second storage node.

4. The memory array of claim 1, wherein said first and second transistors of said first memory cell are configured to receive a clock signal, and wherein said first and second transistors of said second memory cell are configured to receive the inverse of said clock signal.

5. The memory array of claim 4, wherein the memory cells of said array are coupled in series by their test data inputs and data outputs to form a test chain, and wherein said first memory cell and alternate memory cells thereafter of said test chain receive said clock signal on a first clock line, and wherein the other memory cells of said test chain receive the inverse of said clock signal on a second clock line.

6. The memory array of claim 1, wherein:
   said first and second memory cells are arranged in a first column of said memory array, said first memory cell being at one end of said first column at a first side of said memory array, and a final memory cell being at the other end of said first column at a second side of said memory array;
   the memory array comprises a second column adjacent to said first column, another first memory cell being at one end of said second column at said first side of the memory array and a another final memory cell being at the other end of said second column at said second side of the memory array;
   a first test data input of said final memory cell of said second column is coupled to the first storage node of said final memory cell of said first column via said first buffer; and
   a second test data input of said final memory cell of said second column is coupled to the second storage node of said final memory cell of said first column via said second buffer.

7. The memory array of claim 1, wherein said at least one common write line comprises a first common write line and a second common write line.

8. The memory array of claim 7, wherein each of said memory cells further comprises a fifth transistor coupled between said first storage node and a first supply voltage, and a sixth transistor coupled between said second storage node and said first supply voltage, the control node of said fifth transistor being coupled to said first common write line, and the control node of said sixth transistor being coupled to said second common write line.

9. The memory array of claim 8, wherein each memory cell further comprises a seventh transistor coupled between said first storage node and said first supply voltage in series with said fifth transistor, and an eighth transistor coupled between said second storage node and said first supply voltage in series with said sixth transistor, wherein control nodes of said seventh and eighth transistors are coupled to the common selection line of the row.

10. The memory array of claim 1, wherein said first and second inverters each comprises first and second p-channel MOS transistors coupled in series with an n-channel MOS transistor between first and second supply voltages.

11. A method of testing a memory array comprising memory cells arranged in a plurality of columns and in a plurality of rows, the memory cells of each column being coupled to at least one common write line of their column, the memory cells of each row being coupled to a common selection line of their row, wherein each of the memory cells comprises a latch formed of a pair of inverters cross-coupled between first and second storage nodes; a first transistor coupled between said first storage node and a first test data input; and a second transistor coupled between said second storage node and a second test data input, a first of said memory cells having its first and second test data inputs coupled to test sequence input circuitry, and a second of said memory cells having its first test data input coupled to the first storage node of said first memory cell via a first buffer of said first memory cell and its second test data input coupled to the second storage node of said first memory cell via a second buffer of said first memory cell, the method comprising:

applying a first test signal to said first test data input and a second test signal to said second test data input; and activating said first and second transistors such that said first test signal is applied to said first storage node and said second test signal is applied to said second storage node.

* * * * *